(12) United States Patent
Lin et al.

(10) Patent No.: US 7,876,986 B2
(45) Date of Patent: Jan. 25, 2011

(54) SHARED SLAB AWG CIRCUITS AND SYSTEMS

(76) Inventors: Yongbin Lin, 506 Greenacres Dr., Huntsville, AL (US) 35805; Gregory P. Nordin, 1264 Canberra Dr., Lindon, UT (US) 84042; Seunghyun Kim, 10312 Morgan Blvd., Cedar Hills, UT (US) 84062

( * ) Notice: Subject to any disclaimer, the term of this patent is extended or adjusted under 35 U.S.C. 154(b) by 95 days.

(21) Appl. No.: 12/351,468

(22) Filed: Jan. 9, 2009

(65) Prior Publication Data
US 2009/0123113 A1   May 14, 2009

Related U.S. Application Data

(63) Continuation-in-part of application No. 11/950,310, filed on Dec. 4, 2007, now Pat. No. 7,492,988.

(51) Int. Cl.
G02B 6/34    (2006.01)
G02B 6/26    (2006.01)

(52) U.S. Cl. .......................................... 385/37; 385/31

(58) Field of Classification Search .................. 385/37, 385/31
See application file for complete search history.

(56) References Cited

U.S. PATENT DOCUMENTS

| | | | | |
|---|---|---|---|---|
| 6,768,827 | B2 * | 7/2004 | Yoo | 385/14 |
| 2003/0133641 | A1 * | 7/2003 | Yoo | 385/14 |
| 2004/0126057 | A1 * | 7/2004 | Yoo | 385/16 |
| 2005/0135729 | A1 * | 6/2005 | Welch et al. | 385/14 |
| 2005/0213883 | A1 * | 9/2005 | Welch et al. | 385/37 |
| 2007/0223552 | A1 * | 9/2007 | Muendel et al. | 372/50.12 |

OTHER PUBLICATIONS section 2.4 of the 2nd edition of the textbook "Fundamentals of Optical Waveguides" by Okamoto.

* cited by examiner

*Primary Examiner*—K. Cyrus Kianni
(74) *Attorney, Agent, or Firm*—Utah Valley Patent; Steve McDaniel

(57) ABSTRACT

Planar AWG circuits and systems are disclosed that use air trench bends and shared MMI slabs to increase planar circuit compactness.

10 Claims, 8 Drawing Sheets

700a

720a

100a

Related Planar Circuit
720b

100a

Related Planar Circuit
720c

US 7,876,986 B2

SHARED SLAB AWG CIRCUITS AND SYSTEMS

RELATED APPLICATIONS

This application is a continuation-in-part of U.S. patent application Ser. No. 11/950,310 now U.S. Pat. No. 7,492,988 entitled "ULTRA-COMPACT PLANAR AWG CIRCUITS AND SYSTEMS" filed 4 Dec. 2007 for Gregory P. Nordin, Yongbin Lin, and Seunghyun Kim. The aforementioned application is incorporated herein by reference.

FIELD OF THE INVENTION

The invention relates generally to lightwave circuits. Specifically, the invention relates to compact planar AWG (arrayed waveguide grating) circuits and systems.

DESCRIPTION OF THE RELATED ART

Arrayed waveguide gratings typically include curved bends that provide pathlength differences that enable interferometric multiplexing and demultiplexing of lightwave signals. However, curved bends consume considerable circuit area on a planar circuit substrate and typically require substantial layout changes in response to material changes.

SUMMARY OF THE INVENTION

The present invention has been developed in response to the present state of the art, and in particular, in response to the problems and needs in the art that have not yet been fully solved by currently available planar lightwave circuits and systems. Accordingly, the present invention has been developed to provide a planar lightwave circuit and system that overcome many or all of the above-discussed shortcomings in the art.

The present invention provides distinct advantages over the prior art. Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of lightwave circuits and fabrication techniques, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1:
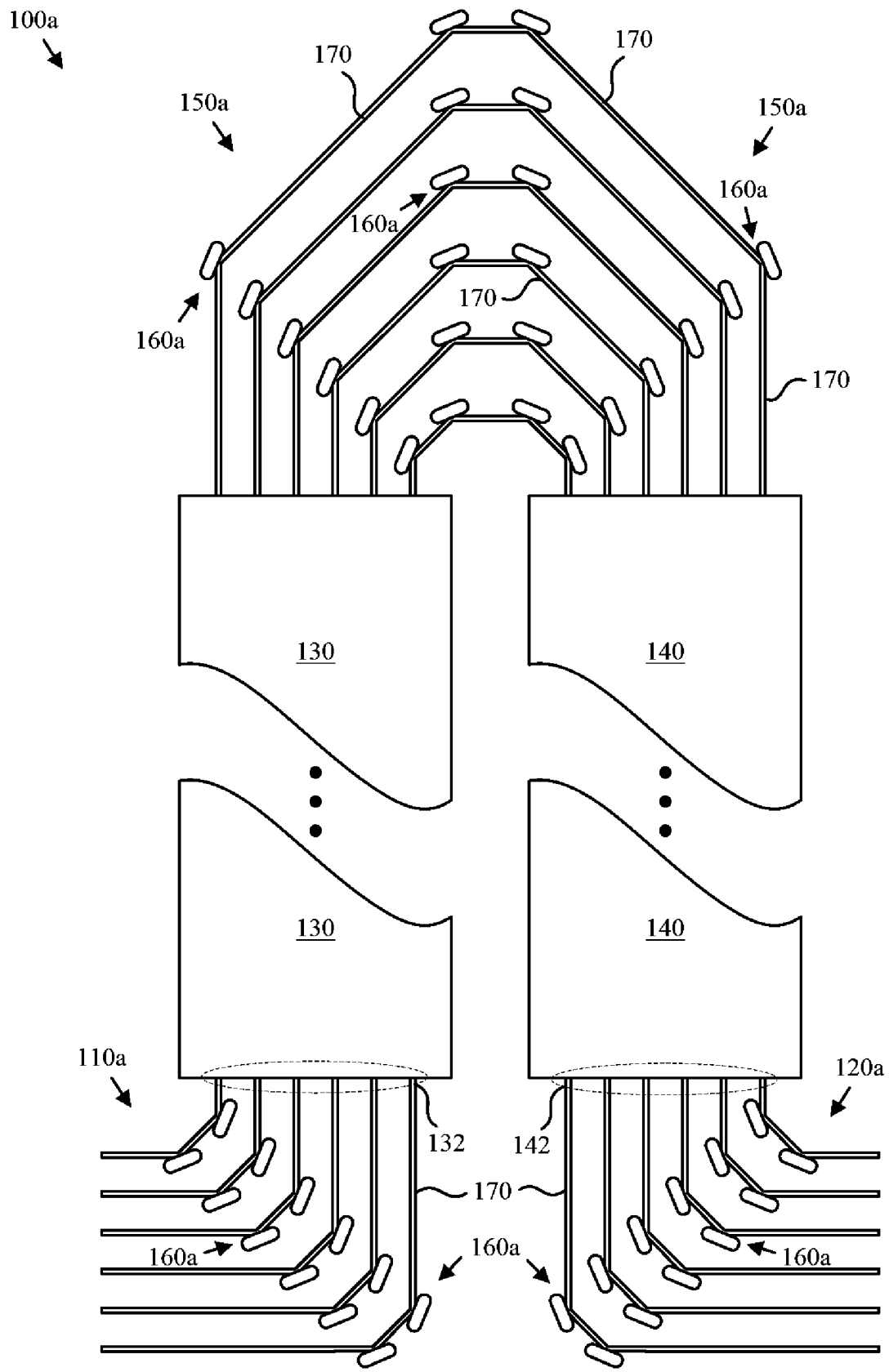
FIG. 1 is a top view planar circuit diagram depicting one example of an ultracompact AWG (arrayed waveguide grating) circuit that is consistent with at least one embodiment of the present invention.
Figure 2:
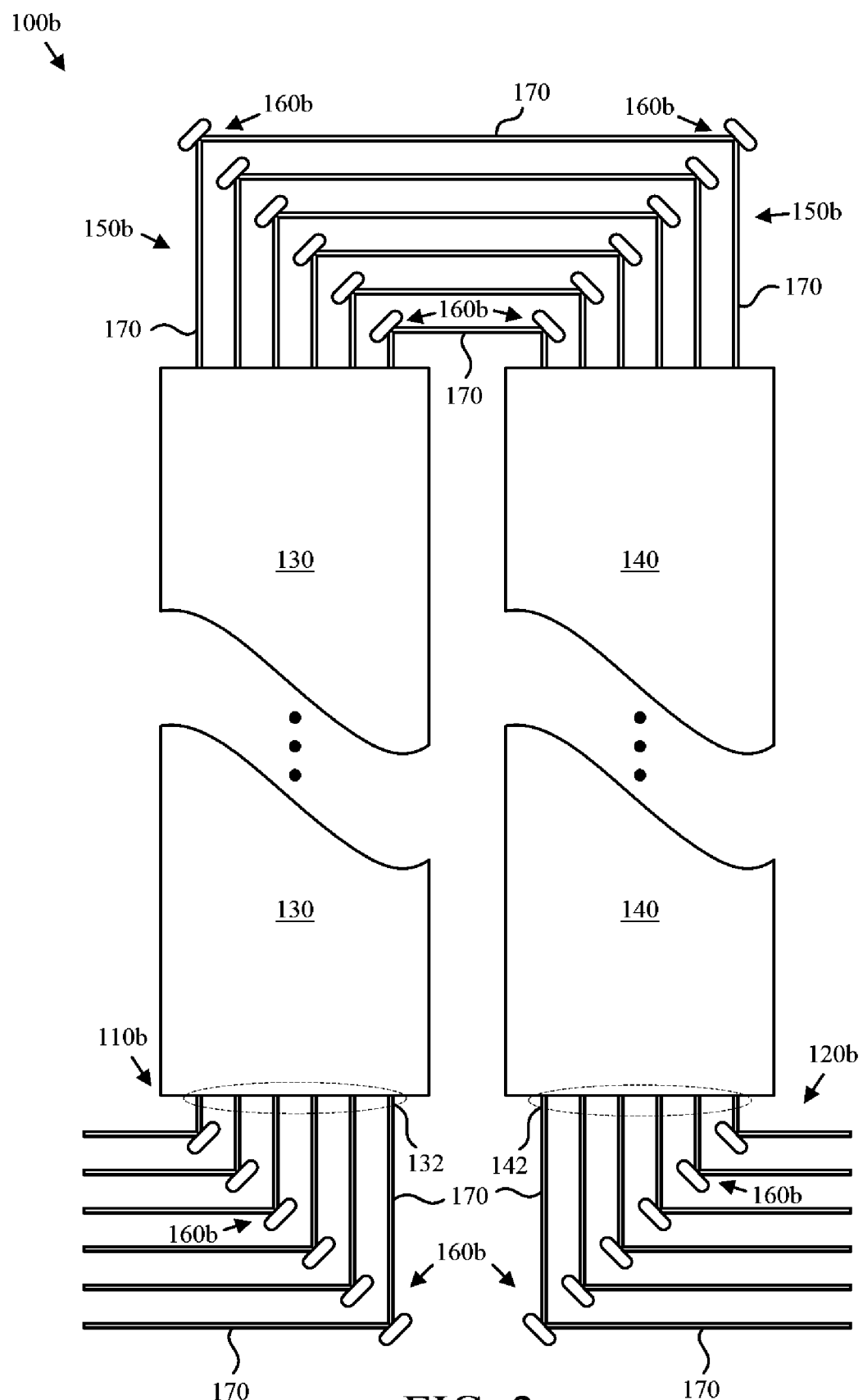
FIG. 2 is a top view planar circuit diagram depicting another example of an ultracompact AWG circuit that is consistent with at least one embodiment of the present invention.

FIGS. 1 and 2 are top view planar circuit diagrams depicting two examples of an ultracompact AWG (arrayed waveguide grating) circuit 100. As depicted, each AWG circuit 100 includes one or more input waveguides 110, one or more output waveguides 120, an input MMI (multi-mode interference) slab 130, an output MMI (multi-mode interference) slab 140, and a set of grating waveguides 150.

The input waveguides 110 are photonically connected to the input MMI slab 130 via a corresponding set of input ports 132. Similarly, the output MMI slab 140 is photonicly connected to the output waveguides 120 via a corresponding set of output ports 142. The input waveguides 110 and output waveguides 120 may bear one or more optical channels. One of skill in the art will appreciate that the number of input waveguides 110 and output waveguides 120 and the number of channels each waveguide bears may be dependent on whether the AWG circuit 100 functions as a multiplexing device or a demultiplexing device.

The grating waveguides 150 photonically connect the input MMI slab 130 to the output MMI slab 140. To accomplish the multiplexing or demultiplexing functionality of the AWG circuit 100, each grating waveguide has a unique path length and therefore a unique phase delay between the input MMI slab 130 and the output MMI slab 140. The interaction of the unique phase delays and the interferometric effects of the MMI slabs 130 and 140 result in the desired multiplexing or demultiplexing of optical signals.

The waveguides 110, 120, and 150 have a low index contrast relative to the (planar) cladding material in which they are formed. Providing bends in low index contrast waveguides has typically required a very gradual curvature in order to retain optical signals within each waveguide. As will be noted in greater detail in FIG. 6, the use of a very gradual curvature has resulted in AWG devices that consume large amounts of planar circuit area.

The planar compactness of the AWG circuit 100 in general, and the grating waveguides 150 in particular, is achieved by the use of reflective bends 160 that interconnect a number of segments 170 within each grating waveguide 150. Similarly, the input waveguides 110 and output waveguides 120 may be substantially more compact than corresponding prior art solutions by using one or more reflective bends 160 to interconnect the segments 170 within each waveguide 110 and 120. The segments 170 may be substantially straight segments that propagate optical signals with little or no loss. As will be described in greater detail for certain embodiments presented in FIGS. 3 and 5, the reflective bends 160 redirect optical signals from one waveguide segment to another and enable effective lightwave propagation with refraction index contrasts of less than 5 percent.

Figure 7:
FIG. 7 is a top view planar circuit diagram depicting one example of a layout methodology that is consistent with at least one embodiment of the present invention.
Figure 8:
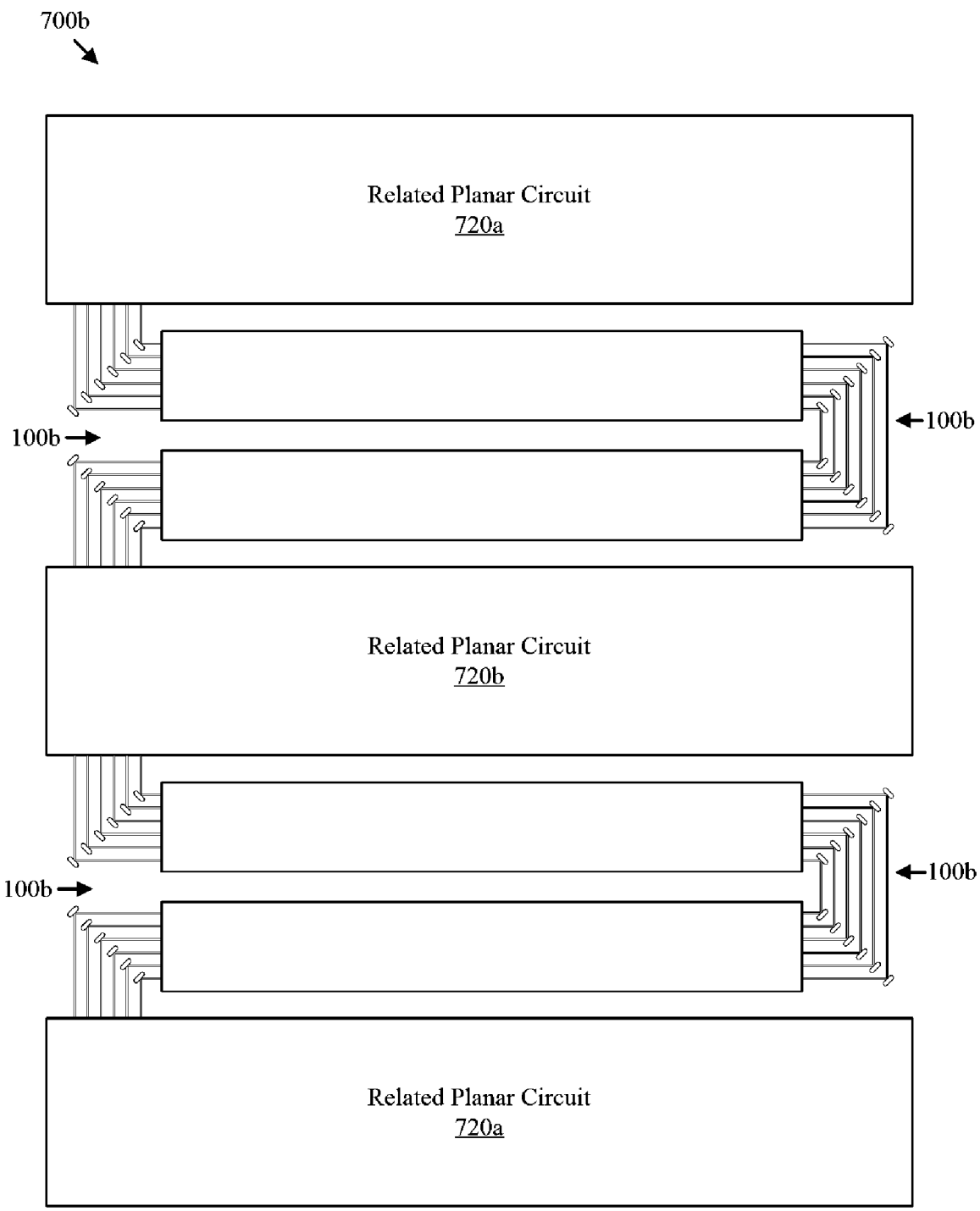
FIG. 8 is a top view planar circuit diagram depicting another example of a layout methodology that is consistent with at least one embodiment of the present invention.

In the depicted embodiments, the input MMI slab 130 and the output MMI slab 140 are adjacent to each other and substantially parallel with each other. The adjacency of the input MMI slabs 130 and output MMI slabs 140 substantially reduces the rectangular surface area required to build the AWG circuit 100 and facilitates efficient integration with related planar circuits as is illustrated in FIGS. 7 and 8.

The number of waveguide segments 170 and reflective bends 160 that are required to achieve a desired bending angle and/or slab adjacency may be dependent on the refractive index of the waveguide material. The AWG circuit 100a depicted in FIG. 1 uses four reflective bends 160a of approximately 45 degrees to achieve a desired bending angle of 180 degrees within each grating waveguide 150a. Similarly, the depicted input waveguides 110a and output waveguides 120a use two reflective bends of approximately 45 degrees to achieve a 90 degree bending angle. In one embodiment, the waveguides and reflective bends of FIG. 1 are constructed of a low index material in the manner depicted in FIG. 3.

The AWG circuit 100b depicted in FIG. 2 uses two reflective bends 160b of approximately 90 degrees to achieve a 180 degree bending angle within the grating waveguides 150b while the depicted input waveguides 110b and output waveguides 120b use a single reflective bend of approximately 90 degrees. In one embodiment, the waveguides and reflective bends of FIG. 2 are constructed of a high index material in the manner depicted in FIGS. 4 and 5.

Figure 3:
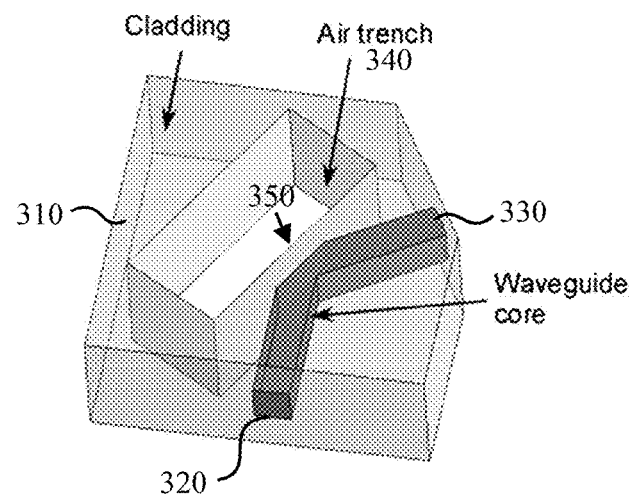
FIG. 3 is a perspective view planar circuit diagram depicting one example of a reflective bend that is consistent with at least one embodiment of the present invention.

FIG. 3 is a perspective view planar circuit diagram depicting one example of a reflective bend 300 that is consistent with at least one embodiment of the present invention. As depicted, the reflective bend 300 includes a planar medium or cladding 310, an input segment 320, an output segment 330, an air trench 340, and a TIR surface 350. The reflective bend 300 is one example of the reflective bend 160a depicted in FIG. 1.

The input segment 320 and the output segment 330 may have substantially identical indices of refraction. In most embodiments, the input segment 320 and output segment 330 are simultaneously formed of the same material and embedded in the planar medium 310. The planar medium or cladding 310 may have an index of refraction that is slightly different from the input segment 320 and the output segment 330 and thus provide a lightwave waveguide of low index contrast. One of skill in the art will appreciate that a wide variety of microfabrication techniques may be used to embed the segments 320 and 330 within the planar medium 310.

In order to bear lightwave signals with little or no loss, the input segment 320 and output segment 330 may be substantially straight segments. Generally, the input segment 320 and the output segment 330 are a portion of two interconnecting segments 170 within a waveguide.

An air trench 340 may be formed in the reflective bend 300 to provide a TIR (total internal reflective) surface 350. In the depicted embodiment, the TIR surface 350 is achieved with a single air trench 340. The TIR surface 350 may include a portion of the input segment 320 and the output segment 330. Generally, the output segment 330 is disposed at a bending angle relative to the input segment 320. The bending angle may be selected to ensure that lightwave signals experience total internal reflection at the TIR surface 350.

In the depicted reflective bend 300, the refractive index of the cladding material 310 and the segments 320 and 330 is generally less than 2.5. In the examples depicted herein, the bending angles for the reflective bends are selected to ensure that at least 90 percent of lightwave energy provided by the input segment 320 is reflected by the TIR surface to the output segment 330. For segments of a relatively low index of refraction such as segments formed in silica, a bending angle of less than 70 degrees may be required to attain total internal reflection and propagate at least 90 percent of the lightwave energy provided to the input segment 320.

Figure 4:
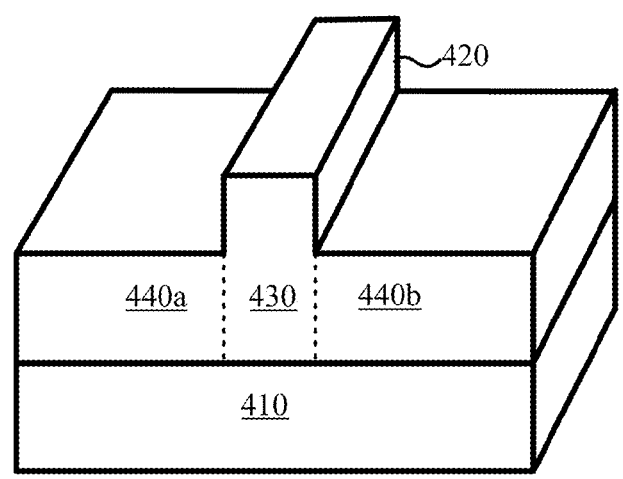
FIG. 4 is a perspective view planar circuit diagram depicting certain aspects of a ribbed waveguide that is consistent with at least one embodiment of the present invention.

FIG. 4 is a perspective view planar circuit diagram depicting certain aspects of a ribbed waveguide 400 that is consistent with at least one embodiment of the present invention. As depicted, the ribbed waveguide 400 includes a substrate 410, a rib 420, a waveguide region 430, and cladding regions 440a and 440b. As is known to those of skill in the art, forming a rib 420 in certain high index materials such as silicon may provide a region having a slightly higher refractive index that may be used as a waveguide region 430 between the cladding regions 440.

Figure 5:
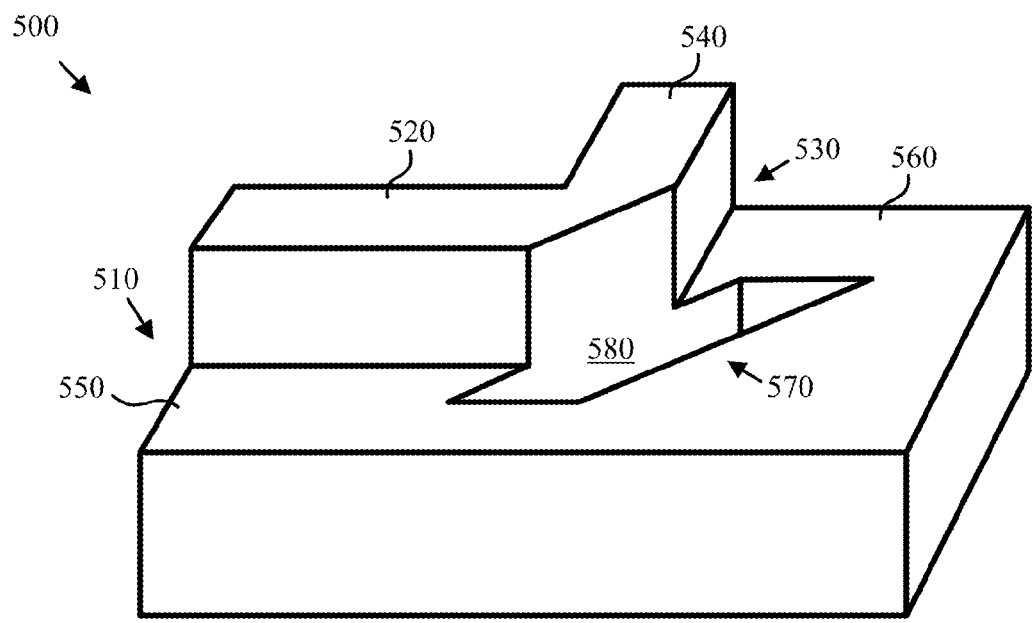
FIG. 5 is a perspective view planar circuit diagram depicting another example of a reflective bend that is consistent with at least one embodiment of the present invention.

FIG. 5 is a perspective view planar circuit diagram depicting another example of a reflective bend 500 that is consistent with at least one embodiment of the present invention. As depicted, the reflective bend 500 includes an input segment 510 under an input rib 520, an output segment 530 under an output rib 540, an input cladding region 550, an output cladding region 560, an air trench 570, and a reflective surface 580. The reflective bend 500 is one example of the reflective bend 160b depicted in FIG. 2.

Formation of the input rib 520 and the output rib 540 may provide waveguide regions below each rib having a slightly increased index of refraction resulting respectively in the input (waveguide) segment 510 and the output (waveguide) segment 530 as well as the input cladding region 550 and the output cladding region 560. In most embodiments, the input rib 520 and output rib 540 are simultaneously formed of the same material. In certain embodiments, the reflective bend 500 is formed of a high index material having a refractive index of greater than 2.0 such as silicon.

In order to bear lightwave signals with little or no loss, the input segment 510 and output segment 530 may be substantially straight. Generally, the input segment 510 and the output segment 530 are a portion of two interconnecting segments 170 within a waveguide. An air trench 570 may be formed in the reflective bend 580 to provide a TIR (total internal reflective) surface 580. In the depicted embodiment, a single air trench 570 is used to provide the TIR surface 580.

The depicted TIR surface 580 includes a portion of the input segment 510 and the output segment 530. The output segment 530 may be disposed at a bending angle relative to the input segment 510. The bending angle may be selected to ensure that lightwave signals experience total internal reflection at the TIR surface 580. Generally, the bending angle is selected to ensure that at least 80 percent of lightwave energy provided by the input segment 510 is reflected by the TIR surface 580 to the output segment 530. For segments of a relatively high index of refraction such as segments formed in silicon, a bending angle of less than 120 degrees may be required to attain total internal reflection and propagate at least 80 percent of the lightwave energy provided to the input segment 510.

Figure 6:
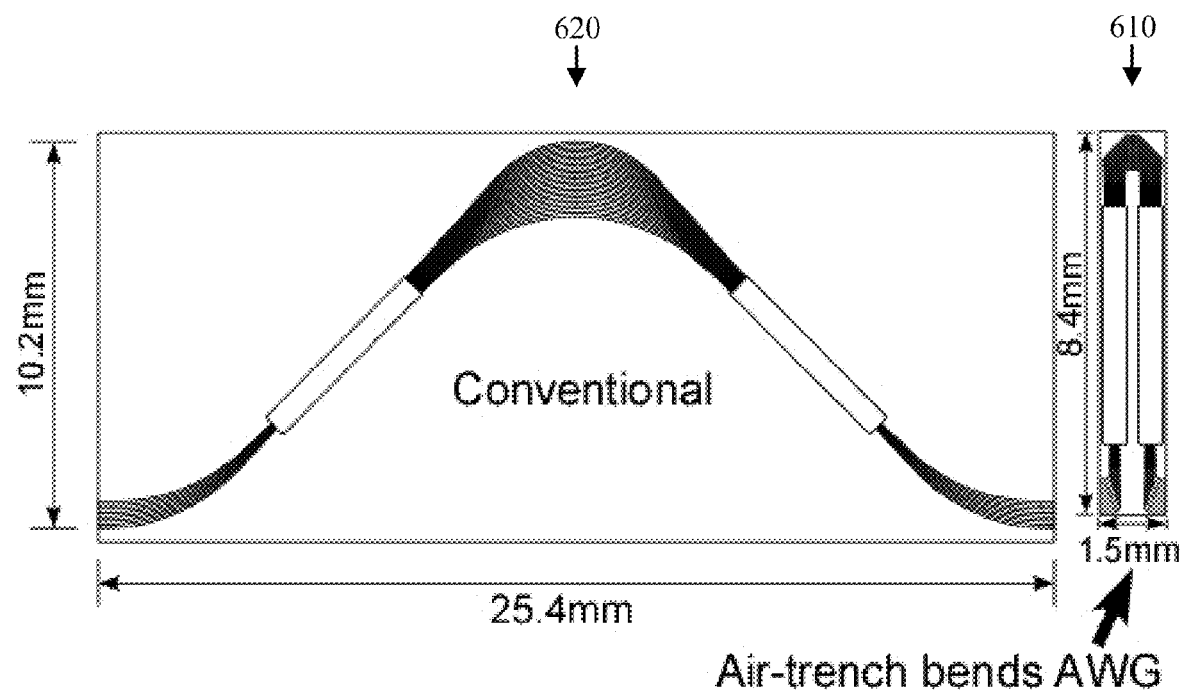
FIG. 6 is a top view circuit diagram comparing the relative size of one AWG circuit of the present invention with a prior art AWG circuit.

FIG. 6 is a top view circuit diagram comparing the relative size of one AWG circuit 610 of the present invention with a prior art AWG circuit 620. As depicted, the AWG circuit 610 occupies a planar rectangular area of approximately 12.6 square millimeters while the prior art AWG circuit occupies a planar rectangular area of approximately 259 square millimeters.

The use of reflective bends and the resulting compactness may increase temperature stability. In the depicted embodiment, a temperature shift less 0.012 nm/C has been demonstrated for the AWG circuit 610 versus 0.059 nm/C for a prior art AWG circuit of similar capability. Another advantage is a large degree of material independence due to the use of total internal reflection (TIR) surfaces. In certain embodiments, other advantages include compatibility with batch microfabrication techniques and reduced birefringence.

FIGS. 7 and 8 are top view planar circuit diagrams depicting two examples of layout methodologies 700 that are consistent with at least one embodiment of the present invention. As depicted, the layout methodologies 700 include one or more AWG circuits 100 interconnected with related planar circuits such as related planar circuits 720a, 720b, and 720c. The related planar circuits 720 may be selected from, or include, a variety of circuits such as optical amplifiers, electronic amplifiers, add/drop circuits, sensors, A/D converters, D/A converters, control units, and the like, that enable highly integrated lightwave systems such as optical switches, add/drop multiplexers, and the like.

The depicted methodologies facilitate alignment of input and output waveguides and increased system compactness. The layout methodology 700b shown in FIG. 8 aligns all input and output waveguides on the same end of the AWG circuits 100 while the layout methodology 700a shown in FIG. 7 alternates ends for the AWG circuits 100 so that the optical signals processed by the related circuits 720 may flow from one end of the circuit to the other end.

Figure 9:
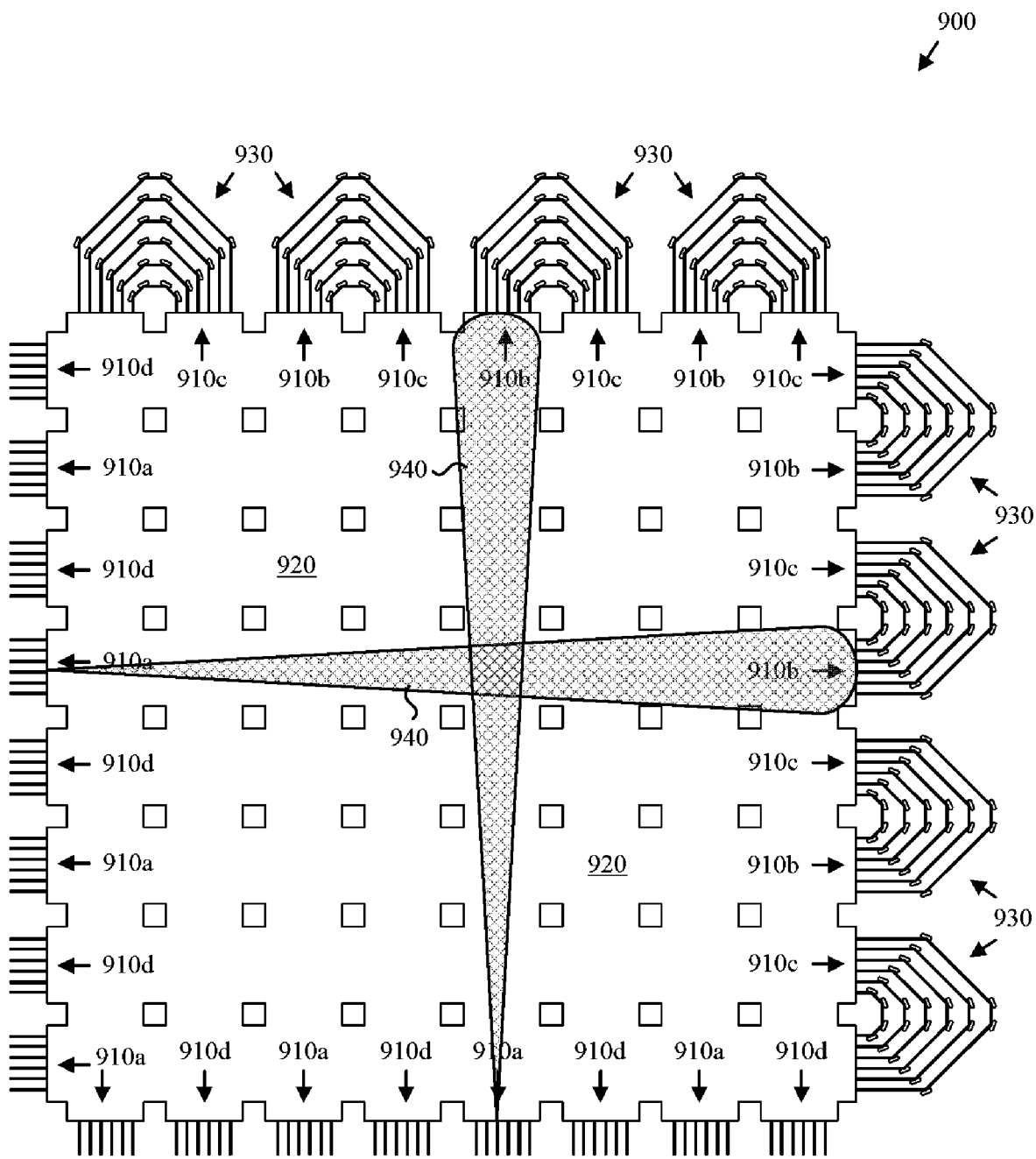
FIG. 9 is a top view planar circuit diagram depicting yet another example of a layout methodology that is consistent with at least one embodiment of the present invention.

FIG. 9 is a top view planar circuit diagram depicting one example of a layout methodology 900 that is consistent with at least one embodiment of the present invention. As depicted, the layout methodology 900 includes multiple port sets 910, a shared MMI slab 920, and grating waveguide sets 930. The layout methodology 900 improves the compactness of AWG circuits and systems.

The port sets 910 provide input ports 910a and output ports 910d that enable connections to and from other optical or electro-optical circuits. The input ports 910a may provide a beam 940 such as a Gaussian beam or the like to the shared MMI slab 920 which expands as it crosses the MMI slab 920. Due to the diameter of the beam 940 at the output ports 910b, the MMI slab 920 photonically couples the input ports 910a to corresponding output ports 910b without providing substantial photonic coupling to other output ports 910b.

The output ports 910b connect the MMI slab to the corresponding grating waveguide set 930. Each grating waveguide of the corresponding grating waveguide set 930 provides a unique optical path length from, and back to, the shared MMI slab 920. The input ports 910c connect the corresponding grating waveguide set 930 back to the MMI slab 920. The MMI slab 920 and the placement of the ports function to photonically couple the beam energy returned by the input ports 910c to the output ports 910d.

One of skill in the art will appreciate that the overall path length difference between the each of input ports 910a and each of the output ports 910d within a port set 910 enables multiplexing or demultiplexing of various channels via multimode interference. One of skill in the art will also appreciate the compactness that is attainable with the layout methodology 900. In one embodiment, 8 AWG circuits with 8 inputs and 8 outputs in each AWG are contained within a planar area of 100 square millimeters.

Figure 10:
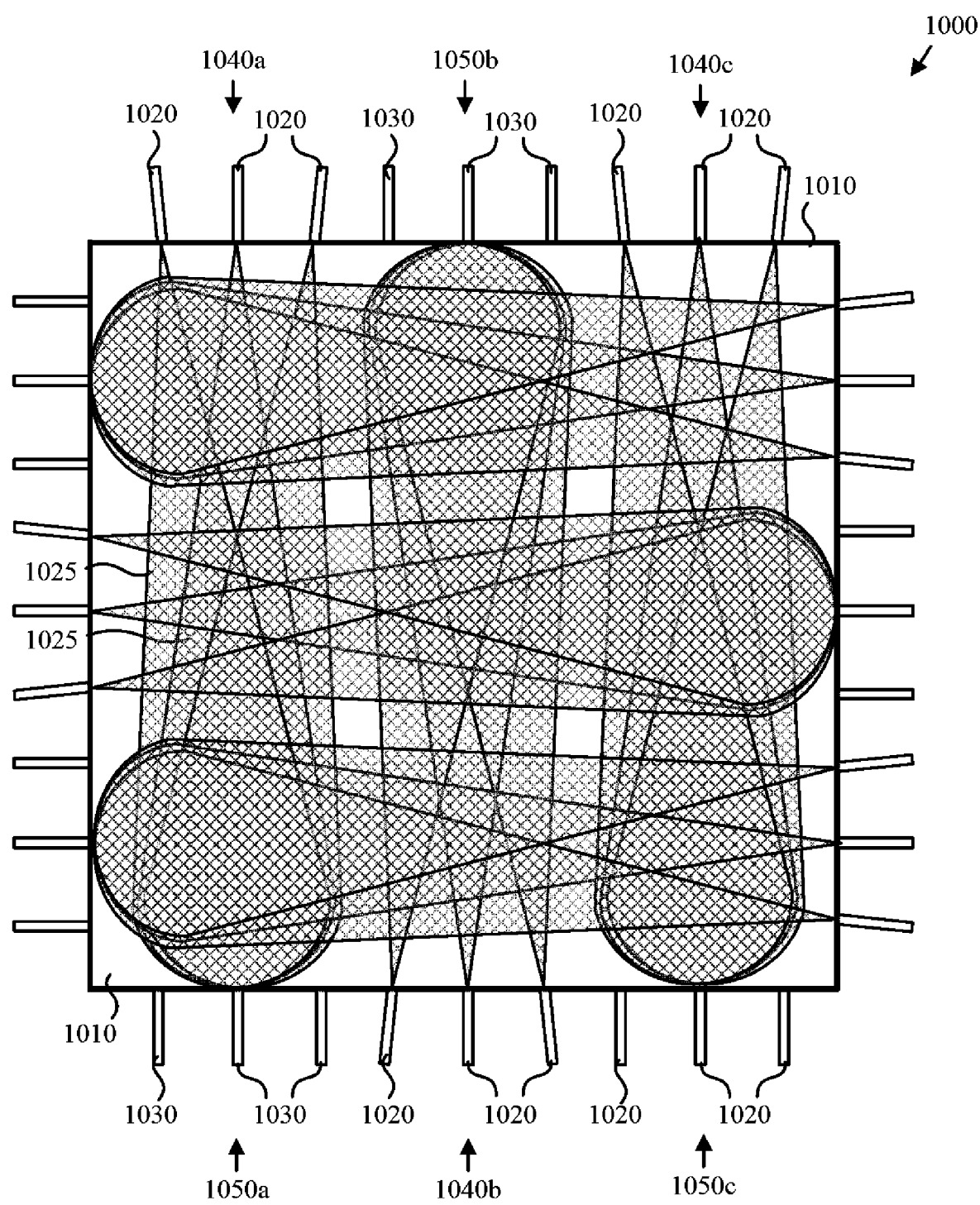
FIG. 10 is a top view planar circuit diagram depicting certain aspects of a shared slab that is consistent with at least one embodiment of the present invention.

FIG. 10 is a top view planar circuit diagram depicting certain aspects of a shared slab that is consistent with at least one embodiment of the present invention. As depicted, the shared slab 1000 includes a slab 1010, a variety of input ports 1020, and a variety of output ports 1030. The shared slab 1000 may be used to form an AWG system such as the system 900 shown in FIG. 9.

The depicted slab 1010 is rectangular in shape. However, one of skill in the art will appreciate that the slab 1010 may assume a variety of shapes that provide the desired spatial relationship between the input ports 1020 and the output ports 1030.

The input ports 1020 are arrange in ports sets 1040 while the output ports are arranged in port sets 1050. Each input port 1020 within a port set 1040 may provide a beam 1025 that illuminates each output port 1030 within a corresponding (i.e. photonically coupled) port set 1050 which is indicated in the reference numbers of FIG. 9 with a common letter suffix.

The input ports 1020 may be angled to provide better illumination to the corresponding port set 1050. Although some energy from a beam 1025 may impinge upon other output ports, the output ports within non-coupled port sets 1050 are not within the beam diameter of the beams 1025 provided by a port set 1040. With a Gaussian beam, for example, the beam diameter may be defined by a conical asymptotic surface that corresponds to a 1/e reduction in the strength of the electric field relative to the electric field strength at the axis of the beam.

The preceding description has been presented only to illustrate and describe a variety of example embodiments and implementations with reference to the accompanying drawings. Despite the details provided herein, it will be evident to one of skill in the art that various modifications and changes may be made, and additional implementations may be implemented, without departing from the scope of the invention as set forth in the claims that follow. The above description and accompanying drawings are accordingly to be regarded in an illustrative rather than a restrictive sense.

What is claimed is:

1. A planar lightwave circuit comprising:
an MMI (multi-mode interference) slab comprising a first set of input ports comprising at least two ports and a second set of input ports comprising at least two ports;
the MMI slab further comprising a first set of output ports comprising at least two ports and a second set of output ports comprising at least two ports;
the first set of input ports positioned to photonically couple each of the first set of input ports to each of the first set of output ports without substantial photonic coupling between each of the first set of input ports and each of the second set of output ports;
the second set of input ports positioned to photonically couple each of the second set of input ports to each of the second set of output ports without substantial photonic coupling between each of the second set of input ports and each of the first set of output ports; and
a plurality of grating waveguides configured to photonically connect the first set of output ports to the second set of input ports.

2. The invention of claim 1, wherein the first set of input ports and the first set of output ports are substantially orthogonal to the second set of input ports and the second set of output ports.

3. The invention of claim 1, wherein the plurality of grating waveguides are embedded in a cladding material, the cladding material having a refractive index of less than 2.5 and the plurality of grating waveguides having an index contrast of less than 5 percent relative to the cladding material.

4. The invention of claim 1, wherein each grating waveguide of the plurality of grating waveguides comprises a plurality of straight segments interconnected with a plurality of reflective bends, each reflective bend comprising:
an input segment,
an output segment disposed at a bending angle of less than 70 degrees relative to the input segment, and
a single air trench forming a TIR (total internal reflective) surface on a portion of the input segment and the output segment, the TIR surface configured to reflect at least 80 percent of lightwave energy provided by the input segment to the output segment.

5. The invention of claim 1, further comprising a related planar circuit that is connected with and adjacent to the MMI slab.

6. The invention of claim 5, wherein the related planar circuit is an add/drop circuit.

7. The invention of claim 5, wherein the related planar circuit comprises at least one circuit selected from the group consisting of an optical amplifier, an electronic amplifier, an add/drop circuit, a sensor, an A/D converter, a D/A converter, a variable attenuator, a tap, a wavelength converter, a phase shifter, a filter, and a control unit.

8. The invention of claim 1, wherein the MMI slab and grating waveguides collectively fit within a planar rectangular area of less than 15 square millimeters.

9. The invention of claim 1, wherein a grating waveguide of the plurality of grating waveguides is a ribbed waveguide formed of a material having a refractive index of greater than 2.0, the ribbed waveguide configured to provide an index contrast of less than 5 percent.

10. The invention of claim 9, wherein the ribbed waveguide comprises a plurality of straight segments interconnected with a plurality of reflective bends, each reflective bend comprising:
an input segment,
an output segment disposed at a bending angle of less than 120 degrees relative to the input segment, and
a single air trench forming a TIR (total internal reflective) surface on a portion of the input segment and the output segment, the TIR surface configured to reflect at least 80 percent of lightwave energy provided by the input segment to the output segment.

* * * * *